(12) United States Patent
Kim et al.

(10) Patent No.: US 11,824,127 B2
(45) Date of Patent: Nov. 21, 2023

(54) SOLAR CELL INCLUDING ALUMINUM-BASED SOLAR ENERGY CONVERSION MATERIAL

(71) Applicant: HANWHA TOTAL PETROCHEMICAL CO., LTD., Seosan-Si (KR)

(72) Inventors: Kise Kim, Seosan-si (KR); Dohoon Lee, Seosan-si (KR); Hosik Chang, Seosan-Si (KR)

(73) Assignee: HANWHA TOTAL PETROCHEMICAL CO., LTD., Seosan-Si (KR)

( * ) Notice: Subject to any disclaimer, the term of this patent is extended or adjusted under 35 U.S.C. 154(b) by 0 days.

(21) Appl. No.: 17/267,612

(22) PCT Filed: Jun. 24, 2019

(86) PCT No.: PCT/KR2019/007604
§ 371 (c)(1),
(2) Date: Feb. 10, 2021

(87) PCT Pub. No.: WO2020/040417
PCT Pub. Date: Feb. 27, 2020

(65) Prior Publication Data
US 2021/0328081 A1    Oct. 21, 2021

(30) Foreign Application Priority Data

Aug. 20, 2018    (KR) .................. 10-2018-0096430

(51) Int. Cl.
*H01L 31/0216*    (2014.01)
*H01L 31/055*    (2014.01)
*H01L 31/18*    (2006.01)

(52) U.S. Cl.
CPC ...... *H01L 31/02168* (2013.01); *H01L 31/055* (2013.01); *H01L 31/18* (2013.01)

(58) Field of Classification Search
CPC .............. H01L 31/048; H01L 31/0488; H01L 31/0481; H01L 31/055; H01L 31/02168; H01L 31/18; C01F 7/30
See application file for complete search history.

(56) References Cited

U.S. PATENT DOCUMENTS

| | | | |
|---|---|---|---|
| 2010/0163104 A1* | 7/2010 | Tseng | ................ H01L 31/055 136/256 |
| 2011/0146758 A1* | 6/2011 | Trouilhet | .............. H01L 31/048 136/258 |

(Continued)

FOREIGN PATENT DOCUMENTS

| | | | | |
|---|---|---|---|---|
| CN | 106566537 A | * | 4/2017 | ............... C01F 7/30 |
| JP | 4677761 B2 | | 4/2011 | |

(Continued)

OTHER PUBLICATIONS

JP-2015221879-A English machine translation (Year: 2015).*

(Continued)

*Primary Examiner* — Andrew J Golden
(74) *Attorney, Agent, or Firm* — Harness, Dickey & Pierce, P.L.C.

(57) ABSTRACT

When a solar wavelength conversion material (solar spectral wavelength converter) produced based on a low-cost aluminum material having an ultraviolet ray absorption spectrum and a visible light emitting spectrum is positioned between a solar cell and an encapsulant of the front surface of the solar cell on which solar light is incident, photocurrent conversion efficiency of the solar cell may be improved by (Continued)

inducing a down-conversion effect and an anti-reflective coating effect at the same time, thereby increasing light-generated current.

13 Claims, 3 Drawing Sheets

(56) References Cited

U.S. PATENT DOCUMENTS

| | | | | |
|---|---|---|---|---|
| 2012/0031486 A1* | 2/2012 | Parce | ............... | H01L 31/055 977/773 |
| 2012/0037226 A1* | 2/2012 | Wu | ............... | H01L 31/055 136/256 |
| 2013/0139868 A1* | 6/2013 | Zhang | ............... | H01L 31/055 257/E31.118 |
| 2013/0340808 A1* | 12/2013 | Komatsu | ............... | H01L 31/055 136/247 |

FOREIGN PATENT DOCUMENTS

| | | | |
|---|---|---|---|
| JP | 5321543 | B2 | 10/2013 |
| JP | 2015221879 | A * | 12/2015 |
| KR | 20090101944 | A | 9/2009 |
| KR | 20140027184 | A | 3/2014 |
| KR | 20170117917 | A | 10/2017 |

OTHER PUBLICATIONS

Alumina Oxide (Alumina), Hydrated, Kirk-Othmer Encyclopedia of Chemical Technology, John Wiley & Sons, vol. 2, 421-433. (Year: 2003).*

CN-106566537-A English machine translation (Year: 2017).*

* cited by examiner

[FIG. 1]
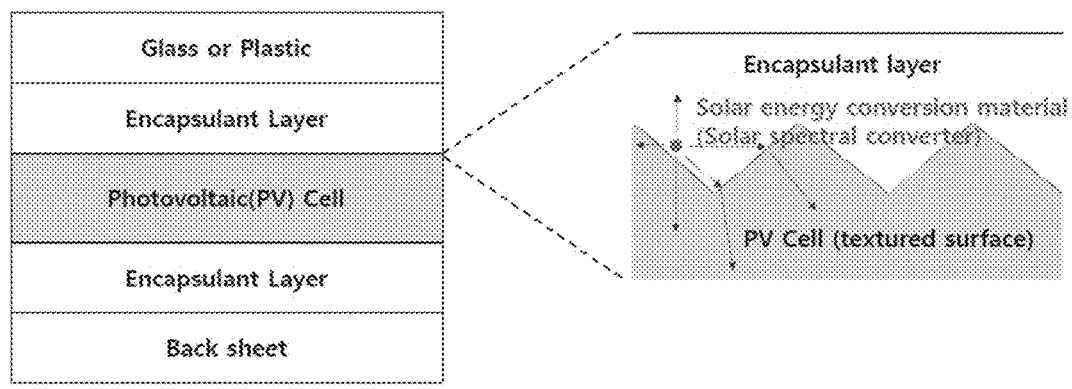
[FIG. 2]
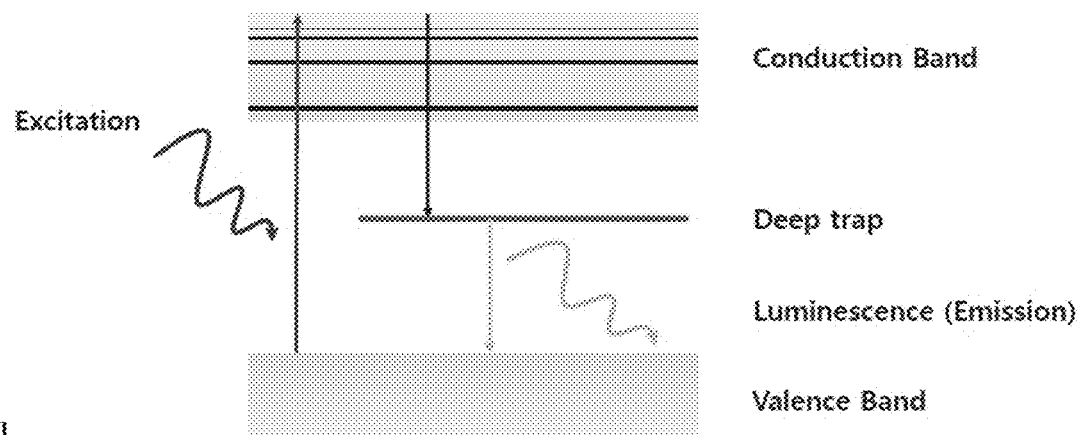

[FIG. 3]
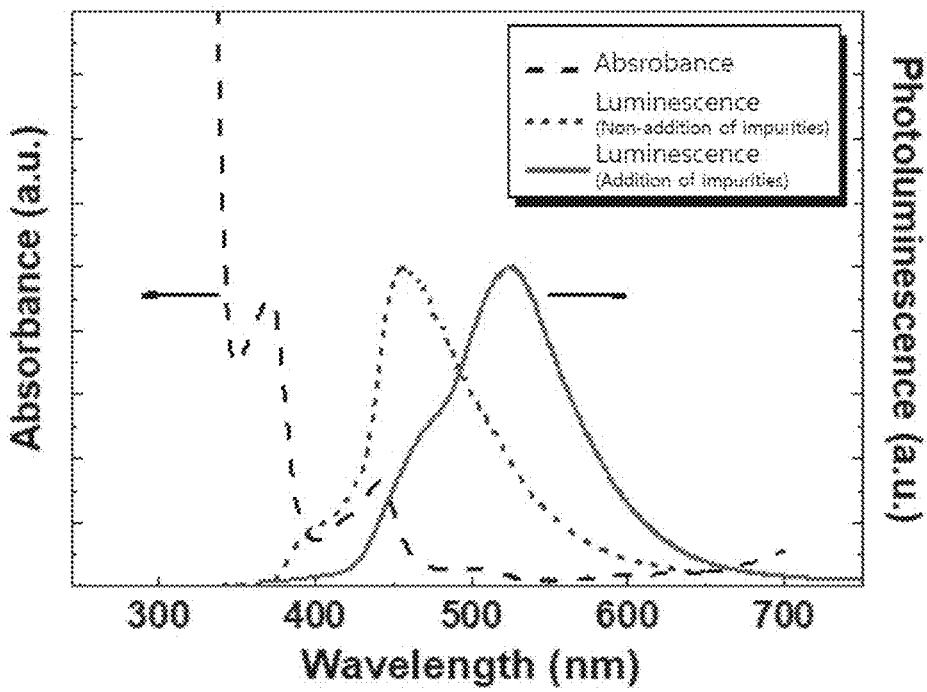
[FIG. 4]
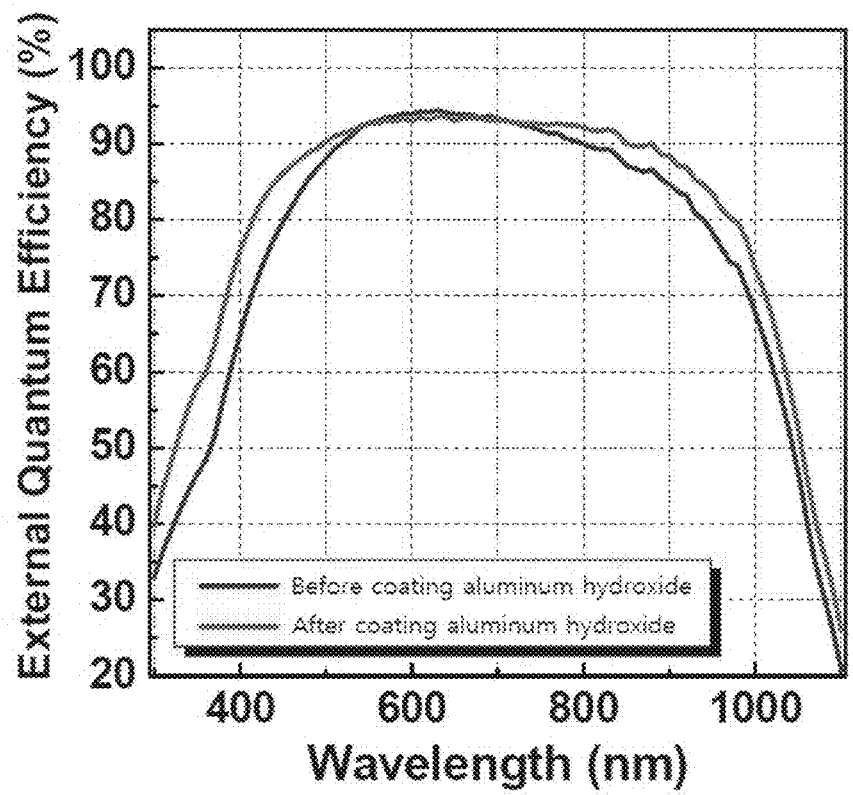

[FIG. 5]
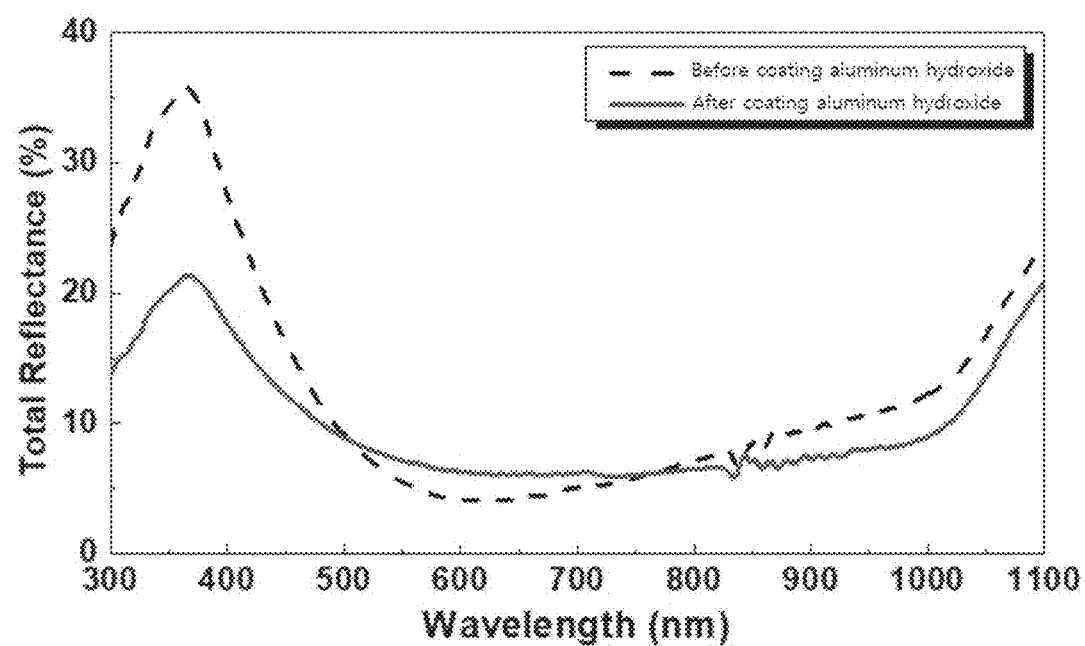

SOLAR CELL INCLUDING ALUMINUM-BASED SOLAR ENERGY CONVERSION MATERIAL

TECHNICAL FIELD

The present disclosure relates to a solar cell(module) with improved efficiency including a low-cost aluminum based solar energy(wavelength) conversion material and a manufacturing method thereof, and relates to a technology of improving photocurrent conversion efficiency according to an increase in short-circuit current by positioning the material on an interface between a solar cell and an encapsulant of the front surface of the solar cell on which solar light is incident, thereby inducing a down-conversion effect and an anti-reflective coating effect at the same time.

The present disclosure relates to a solar cell which can be applied to the materials irrespective of their types of organic photovoltaic cells (OPVs), semiconductor-based solar cells, solar cells based on semiconductors including copper indium gallium selenide (CIGS), cadmium telluride (CdTe), perovskite and the like, silicon-based solar cells, etc., and is characterized by improving photoelectric conversion efficiency by increasing short-circuit current of the solar cell.

BACKGROUND

The most commonly commercialized solar cells are manufactured from a silicon single material, and about 50% of light is not used due to a mismatch between band gaps of a natural solar spectrum and the silicon single material. Namely, the natural solar spectrum has a wide wavelength distribution range (280 to 2,500 nm, 0.5 to 4.4 eV) from ultraviolet rays to infrared rays, whereas a silicon solar cell can absorb only partial wavelengths of ultraviolet and visible light wavelength areas.

For example, the entire solar spectrum is not effectively used in the silicon solar cell owing to parasitic absorption due to silicon surface reflection and the like when solar spectrum is incident on the silicon solar cell, thermal loss (thermalization) in which an energy difference between solar light and silicon is emitted as heat since energy of a solar light band gap is greater than that of a silicon band gap, and a sub-band gap which is transmitted as the sub-band gap is smaller than the band gap.

Recently, research using a solar wavelength conversion material (solar spectral converter) has been proposed to improve photocurrent conversion efficiency of the natural solar light and the silicon solar cell by supplementing this (Chem. Soc. Rev., 2013, 42, 173). That is, it is to introduce into the silicon solar cell a solar wavelength conversion material converting light in an ultraviolet ray region in which solar light absorption of silicon is insufficient or an infrared ray region of which energy is smaller than the silicon band gap into light in a visible ray region in which silicon is capable of absorbing light well.

The solar wavelength conversion material, according to a direction of the wavelength conversion, is largely divided into two types of down-conversion and up-conversion. First, the down-conversion is a technique of absorbing one photon of a short wavelength with higher energy than the silicon band gap (for example, a wavelength of ultraviolet ray) to convert the absorbed photon into one or two or more photons in a long-wavelength area with low energy in which silicon is capable of absorbing light well. On the other hand, the up-conversion is a technique of absorbing two photons of an infrared ray region in which light is not absorbed into silicon, but is transmitted through silicon as energy of the infrared ray region is smaller than that of the silicon band gap to convert the absorbed photons into one photon of a visible ray region in which light is easily absorbed into silicon.

In general, overall power-output improvement of the solar module is induced by positioning a down-conversion material on the front surface of the solar cell on which solar light is incident and positioning an up-conversion material on the rear surface of the solar cell when considering driving principle of the solar spectral wavelength converter, thereby minimizing a spectrum mismatch between the solar light and the silicon solar cell.

SUMMARY

The purpose of the present disclosure is to provide a solar cell including an aluminum-based solar energy conversion material which improves overall power-output of the solar module by supplementing a spectrum mismatch between solar irradiance spectrum and a solar cell formed of various materials including polycrystalline and single crystal silicon solar cells using a low-cost luminescent aluminum hydroxide material as a material of solar wavelength conversion material, and its manufacturing method thereof.

The present disclosure may obtain an effect of improving overall power-output of the solar module by positioning a down-conversion material on the interface thereof as a solar wavelength conversion material positioned on an interface between a solar cell and an encapsulant of the front surface of the solar cell on which solar spectrum is incident, thereby increasing photocurrent. For example, photocurrent conversion efficiency may be improved by absorbing an ultraviolet-ray of solar spectrum in which it is difficult to absorb light into silicon into the solar wavelength conversion material, and then down-converting the absorbed solar spectrum into light in a visible-ray in which light is easily absorbed into silicon, thereby effectively using ultraviolet rays.

Further, unit cost of photovoltaic power generation may be further reduced when applying luminescent aluminum hydroxide to commercialized solar cells since an anti-reflective coating effect may be expected from an interface between an encapsulant and the surface of a silicon solar cell along with a down-conversion effect when using luminescent aluminum hydroxide, which is manufactured based on an aluminum material that is low-cost, has excellent durability and does not include heavy metals, as the solar wavelength conversion material.

As described above, luminescent aluminum hydroxide is used as a solar wavelength conversion material in a solar cell of the present disclosure. Since, when luminescent aluminum hydroxide is applied to the solar cell, light-generated current is increased and overall photoelectric conversion efficiency may be improved by an anti-reflective coating effect in an interface between an encapsulant and the surface of a silicon solar cell along with a down-conversion effect, a solar cell of the present disclosure may secure competitiveness by further reducing unit cost of photovoltaic power generation. In addition, a solar cell of the present disclosure may expect an anti-potential induced degradation (anti-PID) effect of a solar module. It has generally been known that PID is generated since $Na^+$ ions generated from glass of the module are moved on the cell surface. Therefore, aluminum hydroxide on the surface of a solar cell has an effect of protecting the solar cell by collecting $Na^+$ ions.

BRIEF DESCRIPTION OF THE DRAWINGS

FIG. 1 is a cross-sectional diagram of a solar cell into which an aluminum-based solar wavelength conversion material is introduced;

FIG. 2 is a conceptual diagram illustrating luminescence mechanism of the aluminum-based solar wavelength conversion material;

FIG. 3 is a graph illustrating absorption and luminescence spectrums of the aluminum-based solar wavelength conversion material;

(a black dash line indicates absorption, a blue dotted line indicates luminescence (a case in which impurities are not added), and a red solid line indicates luminescence (a case in which impurities are added));

FIG. 4 is a graph illustrating external quantum efficiency (EQE) spectrums of a silicon solar cell before the coating of aluminum hydroxide (blue solid line) and after the coating of aluminum hydroxide (red solid line); and FIG. 5 is a graph illustrating reflectance spectrums of the silicon solar cell before the coating of aluminum hydroxide (black dash line) and after the coating of aluminum hydroxide (red solid line).

DETAILED DESCRIPTION

Hereinafter, a solar cell including an aluminum-based solar wavelength conversion material according to the present disclosure is provided to improve power-output of the solar module by resolving a mismatch between the spectrums of solar irradiance described above and absorption spectrums of a silicon solar cell and a solar cell which is formed of various materials.

In the present disclosure, aluminum hydroxide with luminescence property which is synthesized based on an aluminum material is used as a solar wavelength conversion material which is a low-cost material and has excellent durability in order to apply it to a solar module. A method of synthesizing luminescent aluminum hydroxide includes hydrothermal, sol-gel and thermal decomposition synthesis methods. In the present disclosure, although the present disclosure is described more specifically through a thermal decomposition synthesis method, the scope of the present disclosure is not limited thereto.

In the present disclosure, an aluminum precursor as a solar wavelength conversion material is an aluminum compound corresponding to any one selected from the group consisting of aluminum monoacetate, aluminum triacetate, aluminum diacetate, aluminum triethylaluminum, trimethylaluminum, aluminum alkoxide, diethylaluminum chloride, aluminum sulfate, aluminum cyanide, aluminum nitrite, aluminum carbonate, aluminum sulfite, aluminum hydroxide, aluminum oxide, aluminum chlorate, aluminum sulfide, aluminum chromate, aluminum trichloride, aluminum perchlorate, aluminum nitrate, aluminum permanganate, aluminum hydrogen carbonate, aluminum phosphate, aluminum oxalate, aluminum hydrogen phosphate, aluminum thiosulfate, aluminum chlorite, aluminum hydrogen sulfate, aluminum dichromate, aluminum bromide, aluminum hypochlorite, aluminum chloride hexahydrate, aluminum dihydrogen phosphate, aluminum phosphite, aluminum potassium sulfate dodecahydrate, aluminum bromate, aluminum nitride, and derivatives thereof.

When aluminum hydroxide is synthesized by the foregoing thermal decomposition synthesis method, a material having a boiling point higher than a thermal decomposition temperature of the foregoing single aluminum precursor may be used as a solvent. For example, a material having a high boiling point of 200° C. or more such as hexadecylamine, 1-eicosene, 1-octadecene, docosane, phenyl ether, benzyl ether, octyl ether, oleic acid, oleylamine, or polyisobutylene is used as the solvent.

The foregoing solvent may act as a solvent, and may serve to adjust luminescence property or improve luminescence performance by injecting any one of impurities including carbon, carbonyl radical, oxalic phosphoric, sulfuric acid and so on into the solvent. Further, optical properties such as absorption and luminescence properties may be adjusted by additionally adding impurities including alkyl ($C_1$~$C_n$), acetate and so on in a thermal decomposition synthesis step.

After dispersing a single aluminum precursor into the foregoing solvent in order to produce luminescent aluminum hydroxide, a reaction is performed at a thermal decomposition temperature of the aluminum precursor. When the reaction is finished, a final luminescent aluminum hydroxide may be obtained by separating and purifying a product of the reaction.

The finally produced aluminum hydroxide may include a structure of $Al(OH)_3$, $AlOOH$, $5Al_2O_3 \cdot 2H_2O$, $Al_2O_3$ or the like, and may be marked as aluminum hydroxide, AlOH or hydroxylated alumina hereinafter in the present disclosure. A cause that aluminum hydroxide produced by the thermal decomposition synthesis method shows luminescence property is trap emission caused by defects in metal oxides. FIG. 2 shows a conceptual diagram of trap emission. When defects of material exist, another energy level is formed in an energy level lower than Conduction band, electrons within the Conduction band which have been transferred to the Conduction band from Valence band by an external energy are stabilized and moved to a lower energy level which has been produced due to the defects, and the electrons within the Conduction band emit light while the electrons are being transferred to the Valence band. Various impurities are added in the thermal decomposition synthesis step so that an energy level below the Conduction band may be adjusted, and emission wavelength may also be controlled accordingly.

Since finally synthesized luminescent aluminum hydroxide exhibits luminescence property using only single material of the above-described aluminum precursor even without including expensive lanthanide ions or organic phosphor having luminescence property, the finally synthesized luminescent aluminum hydroxide may further lower electricity generation cost of a photovoltaic module by improving efficiency of the solar cell.

In order to apply a solar wavelength conversion material to a silicon solar cell, the solar wavelength conversion material allows an absorption process to be performed in an ultraviolet ray wavelength, and should have luminescence property in a visible light wavelength. Specifically, it is preferable to form an absorption wavelength in a range of 300 to 450 nm. In addition, it is preferable to form an emission wavelength in a range of 450 to 1,100 nm.

Particularly, it is preferable that the absorption wavelength and the emission wavelength are not overlapped with each other in the solar wavelength conversion material. The reason is that reabsorption in which light emitted from the material is absorbed again when the absorption wavelength and the emission wavelength are overlapped with each other acts as a loss.

Further, since a solar wavelength conversion material capable of performing down-conversion is positioned on the front surface of the solar cell, particles having a wavelength size smaller than that of solar light which is incident on the solar cell are advantageous. Overall efficiency of the solar cell may be rather decreased as solar light which is incident on the solar cell is scattered or reflected if the solar energy conversion material has a particle size that is similar to or larger than wavelength of solar light. Accordingly, the solar spectral wavelength converter preferably has a particle size range of 5 nm or more to 10 µm or less.

FIG. 3 illustrates absorption and luminescence spectrums of aluminum hydroxide produced by the thermal decomposition synthesis method. More specifically, the black dash line shows strong absorption in the ultraviolet ray region by starting absorption at 450 nm as an absorption spectrum of aluminum hydroxide. Further, the blue dotted line shows a maximum luminescence peak at 456 nm as a luminescence spectrum of aluminum hydroxide. Meanwhile, when impurities are added to aluminum hydroxide, a luminescence spectrum of the red solid line is shown, and a maximum luminescence peak is shown at 526 nm in this case. That is, when the impurities are added to aluminum hydroxide, loss due to reabsorption may be minimized by moving the luminescence spectrum to a long wavelength of 70 nm to reduce an overlapping degree of the luminescence spectrum with the absorption spectrum compared to when the impurities are not added to aluminum hydroxide.

Further, the produced aluminum hydroxide by this way has an absolute luminescence efficiency (absolute quantum yield) value of 60% or more.

In the present disclosure, a six-inch polycrystalline silicon solar cell is used as the solar cell, and type and size of material that constitutes the solar cell are not limited thereto.

A method of introducing the foregoing synthesized aluminum hydroxide into the solar cell may include, depending on a place of the solar cell into which the material is introduced, a method of manufacturing the aluminum hydroxide dispersed on the encapsulant into a sheet shape by dispersing the aluminum hydroxide on an encapsulant which performs a role of protecting a silicon solar cell, a method of directly applying the aluminum hydroxide to a front surface of the silicon solar cell, and a method of applying the aluminum hydroxide to the surface of the encapsulant which is joined with the front surface of the solar cell, etc.

First, materials including ethylene vinyl acetate (EVA), polyolefin elastomer (POE), cross-linked polyolefin, thermoplastic polyurethane (TPU, thermal polyurethane), polyvinyl butyral (PVB), silicone, silicone/polyurethane hybrid, ionomer, and so on are used in the encapsulant of the solar cell, and EVA and POE are the most widely used in the encapsulant of the solar cell.

In general, there have been many reports on a method of manufacturing a solar cell module through thermal adhesion (thermal lamination) after positioning the solar spectral wavelength converter on the front surface of the solar cell by introducing a solar spectral wavelength converter into the inside of the encapsulant, and there are some cases in which the method is applied to commercial production.

However, in this case, the light is directed towards the side of the encapsulant sheet since light emitted from a light converting material inside the encapsulant is not directed towards the solar cell due to a large difference between a refractive index (n~1.4) of a polymer such as EVA or POE which constitutes an encapsulant and a refractive index (n~2.5) of $SiN_x$ in the surface of a silicon solar cell, and an optical waveguide phenomenon caused by total internal reflection of the inside of the encapsulant prevails. Such a phenomenon may act as a loss of light on the side of the solar cell.

On the contrary to this, the light is not directed towards the side of the solar cell, but is directed towards the inside thereof by a silicon texturing structure of several µm (microns) to dozens of µm (microns) as the solar energy conversion material is positioned on an interface between the encapsulant and the solar cell when the solar energy conversion material is applied to the surface of the solar cell or the surface of the encapsulant. In addition, photoelectric conversion efficiency may be improved since the entry of light into the direction of the encapsulant, light converting material, and solar cell becomes very advantageous according to Snell's law, thereby enabling the light to be further used on the side of the solar cell if the solar energy conversion material may be adjusted to have a refractive index value between a refractive index (n~1.4) of the encapsulant and a refractive index (n~2.5) of the surface of the solar cell. In other words, both a down-conversion effect and an anti-reflective coating effect of the solar energy conversion material may be expected (FIG. 1).

When the solar wavelength conversion material is dispersed into the solvent, the solar wavelength conversion material dispersed into the solvent may be applied to the surface of the solar cell, and a method of applying the solar wavelength conversion dispersed into the solvent to the surface of the solar cell may include a spin coating method, a bar coating method, a spray coating method, a dip coating method, a screen printing method, etc. Further, all methods except for the spin coating method may be applied even when the solar wavelength conversion material dispersed into the solvent is applied to the encapsulant.

Although a spray coating method enabling rapid and uniform application has been used in the present disclosure by considering commercial production application of the solar wavelength conversion material, the present disclosure is not limited thereto.

Hereinafter, preferred examples of the present disclosure will be described in detail with reference to Examples, but the following Examples are provided only for helping us understand the present disclosure but not for limiting the scope of the present disclosure.

EXAMPLES

Example 1. Production of Luminescent Aluminum Hydroxide

After mixing 1 to 20 wt % of one of the foregoing suggested aluminum precursors with a 1-octadecene or oleic acid solvent, a thermal decomposition reaction was carried out at 200 to 300° C. for 30 minutes in a state of being stirred. After finishing the reaction, aluminum hydroxide was separated from the stirred mixture through centrifugal separation to redisperse the separated aluminum hydroxide into a non-polar solvent such as toluene, chloroform, hexane, or the like. When additionally performing a process of controlling an emission wavelength, after adding 0.1 to 10 wt % of one of the foregoing suggested impurities to the solvent with respect to the weight of the aluminum precursor to carry out a thermal decomposition reaction in the same method as above in a state in which a mixture of the aluminum precursor, the impurity and the solvent was stirred, separation and purification processes were performed on the stirred mixture to produce a luminescent aluminum hydroxide solution. FIG. 3 shows a UV-vis spectrum and a photoluminescence spectrum of the produced luminescent aluminum hydroxide solution, the dark dash line means an absorption spectrum, the blue dotted line means a luminescence spectrum (a case in which the impurities are not added), and the red solid line means a luminescence spectrum (a case in which the impurities are added).

Example 2. Manufacturing of Solar Cells Including Luminescent Aluminum Hydroxide In order to position the foregoing produced aluminum hydroxide particles on an interface between a silicon cell and an encapsulant, the aluminum hydroxide particles could be applied to the front surface of the silicon cell or applied to the rear surface of an upper encapsulant to which a light receiver of silicon cell and the encapsulant were adhered, by using the spray coating method. As another method of introducing aluminum hydroxide, a sheet with a thickness of 100 μm or less was manufactured by dispersing aluminum hydroxide into a light-transmitting resin including the encapsulant, and then aluminum hydroxide could be inserted into the light-transmitting resin in a lamination step for manufacturing a solar cell module. As shown in a diagram of FIG. 1, a silicon solar cell module was manufactured through lamination after sequentially stacking glass, an encapsulant, aluminum hydroxide, a solar cell, an encapsulant, and a back sheet from the front surface of the solar cell on which light was incident. Aluminum hydroxide is positioned on an interface between the encapsulant and the solar cell in the solar cell module manufactured this way.

Experimental Example 1: Performance Evaluation of Solar Cell Including Luminescent Aluminum Hydroxide In order to confirm the power output of the solar cell according to introduction of luminescent aluminum hydroxide, Solar Simulator (WXS-156S-10) of Wacom Co., Ltd. was used, and efficiency changes of the solar cell before and after coating aluminum hydroxide and before and after performing thermal adhesion were all measured. Further, in order to analyze external quantum efficiency by wavelength, IPCE (QEX10) equipment of PV Measurements, Inc. was used, and conversion efficiency changes before and after coating aluminum hydroxide were observed. So as to additionally measure total reflectance according to coating of aluminum hydroxide, UV-3600 NIR (with MPC-3100) of Shimadzu Corporation was used, and efficiency changes of the solar cell before and after coating aluminum hydroxide were analyzed.

Table 1 shows efficiency measurement results of 6-inch polycrystalline silicon solar cells to which luminescent aluminum hydroxide is applied. After measuring all efficiencies of the solar cells before applying aluminum hydroxide to the solar cells to increase precision of measurement efficiency, their efficiency measurement results were compared with the results after applying aluminum hydroxide to the solar cells.

TABLE 1

|    | Samples | Impurity addition | Open-Circuit Voltage (V) | Short-Circuit Current (mA/cm$^2$) | Fill Factor (%) | $P_{max}$ (W) | Efficiency (%) | Δ Efficiency (%) |
|----|---------|-------------------|--------------------------|-----------------------------------|-----------------|---------------|----------------|------------------|
| #1 | Solar Cell 1 |   | 0.6255 | 35.09 | 80.02 | 4.274 | 17.56 |       |
|    | Solar Cell 1 + Aluminum hydroxide | x | 0.6259 | 35.20 | 80.01 | 4.290 | 17.63 | +0.07 |
| #2 | Solar Cell 2 |   | 0.6262 | 35.16 | 80.02 | 4.288 | 17.62 |       |
|    | Solar Cell 2 + Aluminum hydroxide | ○ | 0.6264 | 35.41 | 80.74 | 4.358 | 17.91 | +0.29 |
| #3 | Solar Cell 3 |   | 0.625  | 34.42 | 78.54 | 4.112 | 17.21 |       |
|    | Solar Cell 3 + Aluminum hydroxide | x | 0.6249 | 35.36 | 78.77 | 4.16  | 17.41 | +0.20 |
| #4 | Solar Cell 4 |   | 0.6225 | 34.06 | 79.53 | 4.104 | 17.17 |       |
|    | Solar Cell 4 + Aluminum hydroxide | ○ | 0.6231 | 34.84 | 80.98 | 4.201 | 17.58 | +0.41 |

Table 1 shows that both short-circuit currents and efficiencies are increased more in a case in which aluminum hydroxide is coated on solar cells than a case in which aluminum hydroxide is not coated on the solar cells. In order to verify such efficiency increases, photocurrent conversion efficiencies (IPCE, incident photon-to-current efficiencies) before and after coating aluminum hydroxide were measured, and FIG. 4 shows photocurrent conversion efficiencies according to wavelengths as IPCE measurement results, i.e., external quantum efficiency (EQE) spectrums.

FIG. 4 shows results of the solar cell #4 in Table 1, in which the blue solid line is an EQE spectrum before coating aluminum hydroxide, and the red solid line is an EQE spectrum after coating aluminum hydroxide. Namely, it can be seen from the results of FIG. 4 that conversion efficiencies are increased in a wavelength ranging from 300 nm to near 500 nm by down-conversion of aluminum hydroxide. Further, FIG. 5 is the results of measuring reflectance changes before and after coating aluminum hydroxide on the solar cell #4 in Table 1, in which the black dotted line is a total reflectance before coating aluminum hydroxide on the solar cell #4, and the red solid line is a reflectance spectrum after coating aluminum hydroxide on the solar cell #4. It can be seen that reflectance values are more decreased in spectrum area ranges of 300 to 500 nm and 800 to 1,100 nm after performing the coating process.

That is, aluminum hydroxide is coated on the surface of a silicon solar cell so that short-circuit current of the silicon solar cell is increased and overall efficiency according thereto is increased by a down-conversion effect due to absorption of ultraviolet light and luminescence of visible light and an anti-reflective coating effect in which light easily enters the inside of the silicon solar cell as a refractive index of aluminum hydroxide has a value between a refractive index of the surface of the silicon solar cell and a refractive index of the encapsulant ($1.5 < n_{aluminum\ hydroxide} < 2.5$).

Table 2 shows efficiency changes before and after introducing aluminum hydroxide into a silicon solar cell mini-module manufactured in Example 2.

TABLE 2

| | Samples | Open-Circuit Voltage (V) | Short-Circuit Current (mA/cm$^2$) | Fill Factor (%) | $P_{max}$ (W) | Efficiency (%) | Δ Efficiency (%) |
|---|---|---|---|---|---|---|---|
| 1 | Solar Cell 5 after lamination | 0.6219 | 34.05 | 0.7893 | 4.068 | 17.02 | |
| | (Solar Cell 5 + Aluminum hydroxide) after lamination | 0.6221 | 34.81 | 0.7956 | 4.118 | 17.23 | +0.23 |
| 2 | Solar Cell 6 after lamination | 0.6213 | 34.02 | 0.7909 | 4.069 | 17.02 | |
| | (Solar Cell 6 + Aluminum hydroxide) after lamination | 0.6215 | 34.93 | 0.7983 | 4.142 | 17.33 | +0.31 |

It is confirmed even in a module form similarly as in the results of Table 1 even that both short-circuit currents and efficiencies in solar cells into which aluminum hydroxide is introduced have been increased more than those in the solar cells into which aluminum hydroxide is not introduced.

What is claimed is:

1. A solar cell comprising a luminescent aluminum hydroxide in an interface between an encapsulant of a front surface of the solar cell on which solar light is incident and the solar cell,
   wherein the aluminum hydroxide is generated by a thermal decomposition synthesis method from a single aluminum precursor,
   wherein photocurrent conversion efficiency is improved, and
   wherein the thermal decomposition synthesis method of the luminescent aluminum hydroxide comprises injecting an impurity selected from the group consisting of carbonyl radical, oxalic acid, phosphoric acid, and sulfuric acid.

2. The solar cell of claim 1, wherein a maximum absorption wavelength of the luminescent aluminum hydroxide is formed between 300 nm and 450 nm, and a maximum emission wavelength of the luminescent aluminum hydroxide is formed between 450 nm and 1,100 nm.

3. The solar cell of claim 1, wherein the luminescent aluminum hydroxide is coated on the front surface of the solar cell.

4. The solar cell of claim 1, wherein the luminescent aluminum hydroxide is coated on a surface of the encapsulant which is adhered to the front surface of the solar cell.

5. The solar cell of claim 1, wherein the luminescent aluminum hydroxide is positioned between the solar cell and the encapsulant by inserting a manufactured film between the encapsulant which is adhered to the front surface of the solar cell and the front surface of the solar cell,
   wherein the manufactured film has a thickness of 100 μm or less and is prepared by dispersing the luminescent aluminum hydroxide into a light transmitting resin comprising the encapsulant.

6. The solar cell of claim 3, wherein the coating method is a spray coating method.

7. The solar cell of claim 3, wherein the coating method is a screen printing method.

8. The solar cell of claim 5, wherein the encapsulant is formed of any one selected from the group consisting of ethylene vinyl acetate (EVA), polyolefin elastomer (POE), cross-linked polyolefin, thermoplastic polyurethane (TPU), polyvinyl butyral (PVB), silicone, silicone/polyurethane hybrid, and ionomer.

9. The solar cell of claim 1, wherein the luminescent aluminum hydroxide has a particle size of 10 μm or less.

10. The solar cell of claim 1, wherein the aluminum precursor is any one selected from the group consisting of aluminum monoacetate, aluminum triacetate, aluminum diacetate, aluminum triethylaluminum, trimethylaluminum, aluminum alkoxide, diethylaluminum chloride, aluminum sulfate, aluminum cyanide, aluminum nitrite, aluminum carbonate, aluminum sulfite, aluminum hydroxide, aluminum oxide, aluminum chlorate, aluminum sulfide, aluminum chromate, aluminum trichloride, aluminum perchlorate, aluminum nitrate, aluminum permanganate, aluminum hydrogen carbonate, aluminum phosphate, aluminum oxalate, aluminum hydrogen phosphate, aluminum thiosulfate, aluminum chlorite, aluminum hydrogen sulfate, aluminum dichromate, aluminum bromide, aluminum hypochlorite, aluminum chloride hexahydrate, aluminum dihydrogen phosphate, aluminum phosphite, aluminum potassium sulfate dodecahydrate, aluminum bromate, aluminum nitride, and derivatives thereof.

11. The solar cell of claim 1, wherein the luminescent aluminum hydroxide comprises one or more structures selected from the group consisting of Al(OH)$_3$, AlOOH, 5Al$_2$O$_3$·2H$_2$O, and Al$_2$O$_3$.

12. The solar cell of claim 4, wherein the coating method is a spray coating method.

13. The solar cell of claim 4, wherein the coating method is a screen printing method.

* * * * *